United States Patent
Walvoord et al.

(10) Patent No.: US 6,278,078 B1
(45) Date of Patent: Aug. 21, 2001

(54) LASER SOLDERING METHOD

(75) Inventors: John Walvoord, Orlando; Linda Woody, Sumterville, both of FL (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/323,944

(22) Filed: Jun. 2, 1999

(51) Int. Cl.$^7$ .................................................. B23K 26/20
(52) U.S. Cl. ............................... 219/121.61; 219/121.85
(58) Field of Search ...................... 219/121.61, 121.78, 219/121.85; 228/102, 180.21

(56) References Cited

U.S. PATENT DOCUMENTS

| | | | |
|---|---|---|---|
| 4,327,277 | * 4/1982 | Daly | 219/121.64 |
| 4,531,044 | * 7/1985 | Chang | 219/121.85 |
| 4,547,652 | * 10/1985 | Raisig et al. | 219/121.64 |
| 4,700,044 | * 10/1987 | Hokanson et al. | 219/121.63 |
| 4,877,175 | * 10/1989 | Jones et al. | 228/102 |
| 4,963,714 | 10/1990 | Adamski et al. . | |
| 5,045,669 | 9/1991 | Ortiz, Jr. et al. . | |
| 5,279,045 | * 1/1994 | Odashima et al. | 34/360 |
| 5,552,575 | 9/1996 | Doumanidis . | |
| 5,580,471 | 12/1996 | Fukumoto et al. . | |
| 5,607,605 | 3/1997 | Musasa et al. . | |
| 5,614,113 | 3/1997 | Hwang et al. . | |
| 5,650,077 | 7/1997 | Zinke . | |
| 5,681,490 | 10/1997 | Chang . | |
| 5,742,025 | 4/1998 | Dittman et al. . | |
| 5,808,271 | 9/1998 | Duthoo . | |
| 5,998,758 | * 12/1999 | Moser et al. | 219/121.63 |

OTHER PUBLICATIONS

Mary E. Fitzgerald, "The Great White Way Gets Brighter", Photonics Spectra, Sep. 1996, pp. 23–24.
Howard Berkowitz, "Laser Soldering of Fine Pitch SMT Devices", Soldering and Surface Mount Technology, Sep. 3, 1997, pp. 41–43.

* cited by examiner

*Primary Examiner*—Samuel M. Heinrich
(74) *Attorney, Agent, or Firm*—Burns, Doane, Swecker & Mathis, LLP

(57) ABSTRACT

An automated soldering technique and device are provided that are robust and reliable. A laser is used to heat metallic components to be soldered, and a wavelength of the laser is chosen based in light absorption characteristics of the metallic components. The laser wavelength can be, for example, about 825 nanometers. A soldering location at which the laser forms a beam spot is located at a predetermined distance away from a focus of the laser beam, so that the beam spot is defocused and has a uniform intensity across its area. The beam spot can be sized to simultaneously encompass a plurality of solder joint locations. The beam spot size and path across a plurality of solder joint locations are selected so that those portions of the solder joint locations which are touched by the beam have the same heat sinking properties. A camera is also provided coaxially with the laser beam, and a dichroic prism is positioned between the laser beam and the camera. The dichroic prism deflects laser light toward the soldering location, and passes visible light from the soldering location to the camera.

49 Claims, 7 Drawing Sheets

LASER SOLDERING METHOD

BACKGROUND OF THE INVENTION

1. Field of the Invention

The present invention relates to the field of fusing materials using a laser, and particularly to soldering metallic objects such as electrical connections between a printed circuit board and an electrical component.

2. Background Information

U.S. Pat. No. 5,580,471 to Fukumoto et al. and U.S. Pat. No. 4,963,714 to Adamski et al. exemplify several conventional automated laser soldering techniques.

The Fukumoto patent discloses an automated laser soldering device that includes a semiconductor diode which is used to generate a plurality of laser beams, which are transmitted and combined using optical fibers. The exit ends of the optical fibers are directed toward a mirror which reflects the laser light emitted from the optical fibers into a lens assembly. The lens assembly focuses the laser light onto objects to be soldered together, so that the laser light can heat the objects and melt solder to fuse the objects together. The mirror or scanner is rotated to change an angle of incidence between the laser light and the mirror's surface, and thereby reflect the laser light to different locations on an object to be soldered such as a printed circuit board. Instead of simply moving the laser beam across the object when moving the beam from one soldering location to another soldering location as in other conventional laser soldering methods, the laser is turned off while the mirror rotates, so that locations other than soldering locations will not be struck and heated by the beam. An off-axis camera and image processing equipment are also provided to help monitor and control operation of the laser soldering device.

The Adamski patent discloses an automated laser soldering system that includes a plurality of laser diodes, each with an optic fiber for directing the output of the diode to a soldering location. The laser diodes are organized into a plurality of groups. For each group, the outputs of the optic fibers for the laser diodes in the group are combined to provide a single beam. The single beam outputs of the groups are simultaneously focused on different soldering locations on a printed circuit board, to simultaneously form solder Joints at the different soldering locations.

In conventional automated laser soldering techniques where the laser beam is focused on a soldering location so that the beam only strikes a component to be soldered and not, for example, a portion of a circuit board the component is located on, it can be difficult to control an intensity of the beam to prevent overheating of the components to be soldered while also ensuring that the temperatures rise high enough for the solder to properly flow into the joint and bond with the components. Furthermore, the beam must be accurately located on the component to be soldered, because when the beam spot is only just large enough to cover the component to be soldered, slight misalignments of the beam can cause the beam to partially or completely miss the component to be soldered. However, if the beam spot is made larger than the component area to be soldered to reduce sensitivity to misalignment, then the excess portion of the laser beam will strike and can damage other objects such as a non-metallic printed circuit board supporting the component.

In the electrical device industries, hand soldering techniques are often used instead of automated soldering techniques in specific situations for a variety of reasons. These reasons include, for example, physical or mechanical constraints, high temperature sensitivity of components to be soldered, and avoidance of tooling costs. However, product quality can vary unacceptably when hand soldering techniques are used due to such factors as operator error, and natural operator variations from solder joint to solder joint. For example, even a highly skilled human operator will apply a soldering iron in a slightly different way for a slightly different time duration at each solder joint. In situations where the operator also manually applies a quantity of solder, the quantity of solder applied to each joint can also vary. Furthermore, hand soldering techniques are typically slow in comparison to automated soldering techniques. These drawbacks magnify as a distance or pitch between adjacent soldering locations decreases.

Accordingly, a need exists for an automated soldering technique that can be used to reliably and quickly solder temperature-sensitive components without causing damage to the components, while simultaneously providing better test yields than conventional hand soldering techniques.

SUMMARY OF THE INVENTION

In accordance with an exemplary embodiments of the invention, an automated soldering technique and device are provided that are robust and reliable and can be used to mimic hand soldering techniques while providing greater speed and test yields. A laser wavelength is chosen that is well-absorbed by the metallic components to be soldered, but is less well-absorbed by the non-conductive materials or circuit boards supporting the metallic components. The laser wavelength can be, for example, near 825 nanometers, and can be, for example, within a range of 825 nanometers ±35 nanometers. In accordance with an exemplary embodiment of the invention, the device is configured so that a spot size of the laser beam at a soldering location is greater than an area of a component or a solder joint to be soldered. The laser beam spot size can be made large enough to simultaneously encompass several solder joint locations on a printed circuit board.

In an exemplary embodiment of the invention, the laser beam is defocused so that the soldering location where the laser beam strikes to form a beam spot is not located at a focus or focal point of the laser beam. This defocusing ensures that an intensity or energy density of the beam is effectively uniform across the beam spot. In accordance with an embodiment of the invention, the beam spot is moved at a substantially constant speed across one or more solder joint locations, and a power level of the laser beam is maintained at a substantially constant level as the beam spot is moved across the solder joint location(s). A camera can also be provided, for example with an optical axis that is substantially coaxial with the laser beam, to help monitor and control operation of the device.

BRIEF DESCRIPTION OF THE DRAWINGS

Other objects and advantages of the invention will become apparent to those skilled in the art from the following detailed description of preferred embodiments, when read in conjunction with the accompanying drawings. Like elements in the drawings have been designated by like reference numerals.

PIG. 5 shows a lens system in accordance with an exemplary embodiment of the invention.

Figure 6:
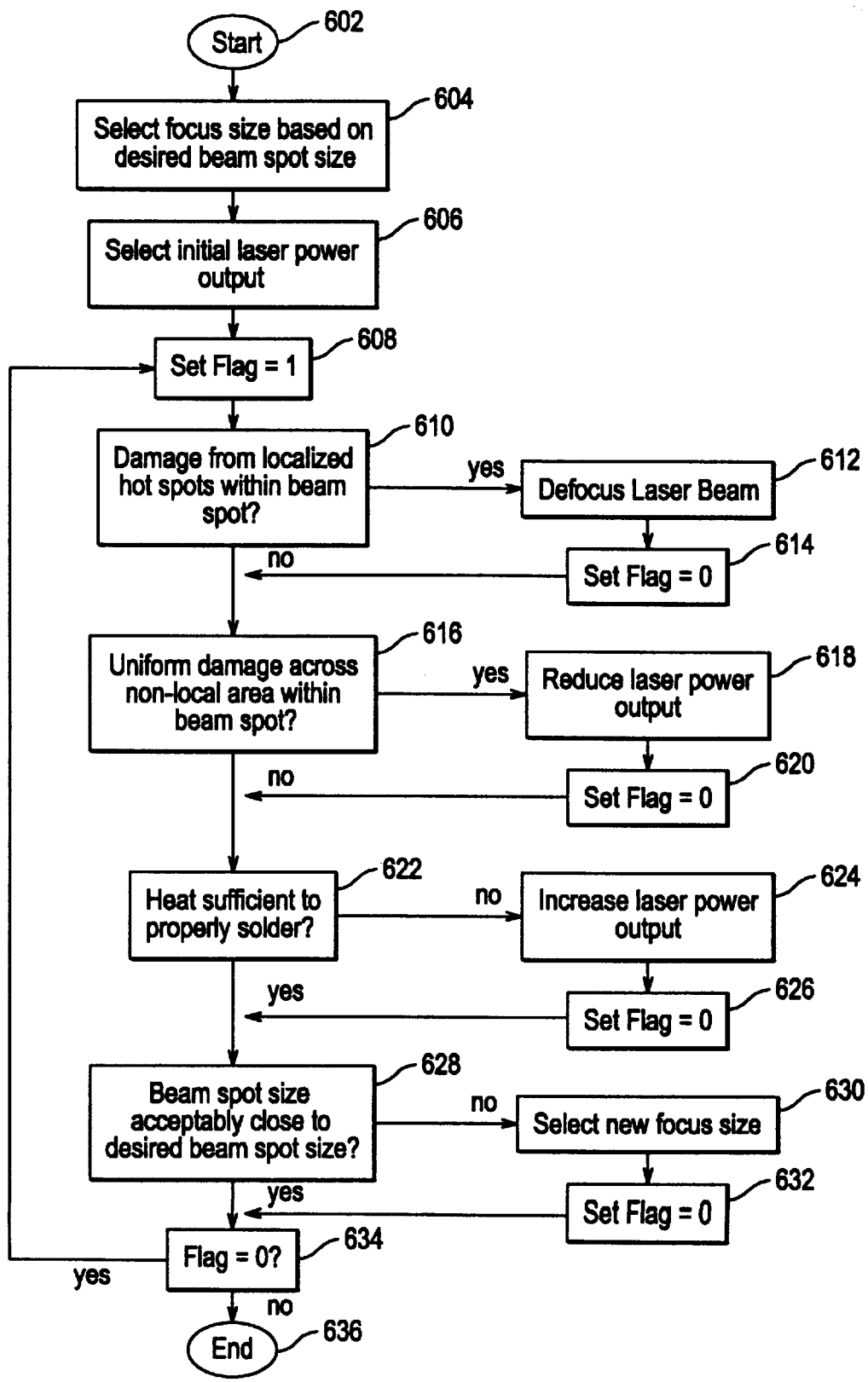

FIG. 6 shows a process in accordance with an exemplary embodiment of the invention for adjusting a defocus amount and/or a laser power setting during a soldering process or a calibration process.

DETAILED DESCRIPTION OF THE PREFERRED EMBODIMENTS

Figure 1:
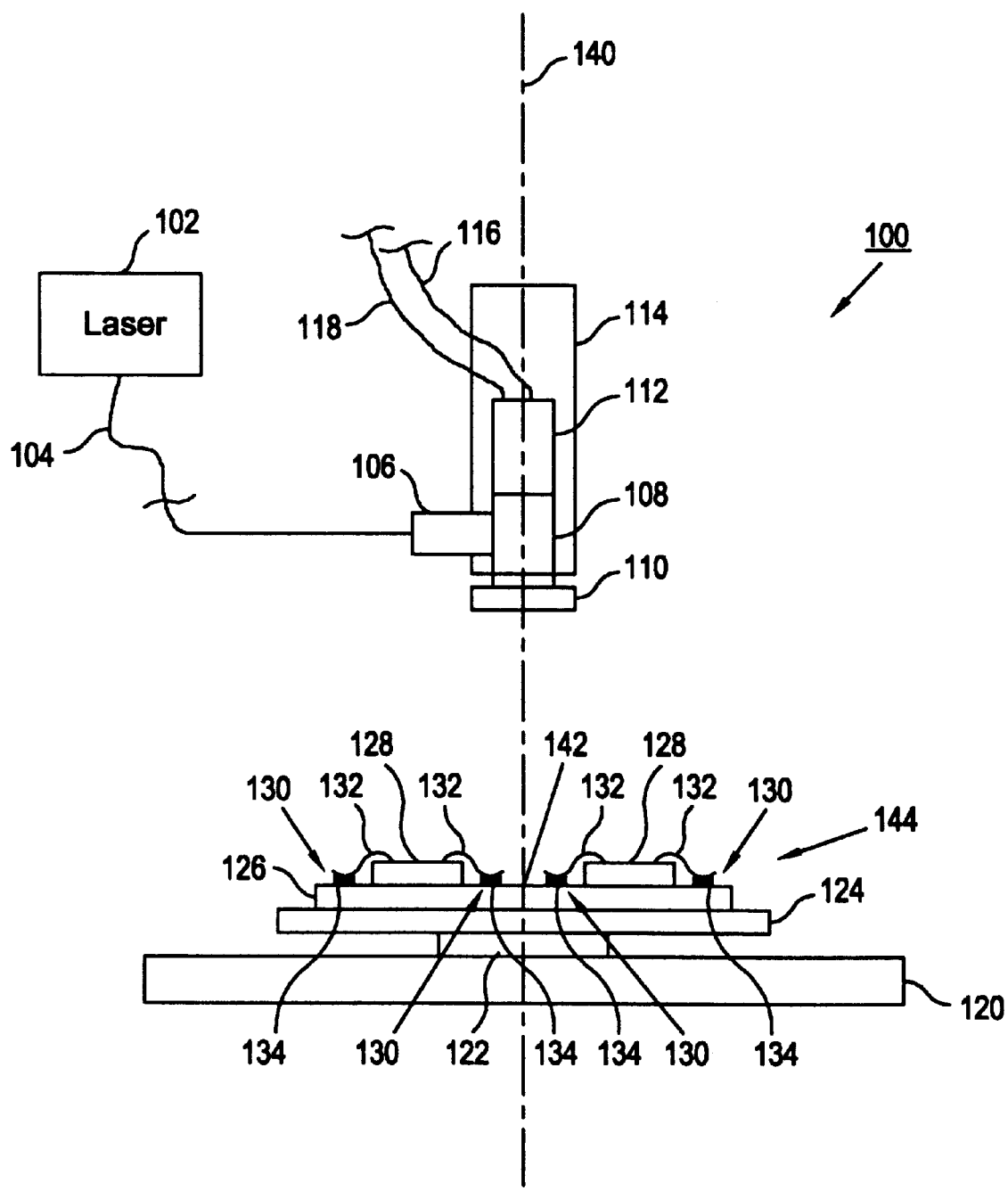
FIG. 1 shows a side view of an exemplary embodiment of the invention.

FIG. 1 shows a laser soldering machine 100 in accordance with an exemplary embodiment of the invention. The machine 100 includes a laser 102 which can be, for example, a laser diode. Light from the laser 102 is provided via an optic cable or optic fiber bundle 104 to a lens cell 106, which provides the light to an imaging optics unit 108. The optics unit 108 emits the laser light along a Z axis 140 toward a soldering location 142. The lens cell 106 and the optics unit 108 are attached to a support beam 114. A camera 112 is also provided on the support beam 114, with an optical view along the axis 140. A power cable 116 supplies the camera 112 with electrical power, and a video out cable 118 carries image data captured by the camera 112 to an image display such as a video monitor (not shown) for monitoring and controlling soldering operations of the machine 100.

In accordance with an exemplary embodiment of the invention, the optics unit 108 can be provided with a dichroic prism (not shown) that deflects the non-visible laser light provided by the lens cell 106 so that it travels along the axis 140 toward the soldering location 142. The dichroic prism allows visible light to travel in a reverse direction along the axis 140 and through the dichroic prism to the camera 112, so that the camera 112 can capture images of the soldering process along the axis 140. A ring light 110 can be provided to illuminate the soldering location 142 along the axis 140, to enhance the images captured by the camera 112.

The soldering location 142 is the portion of surface area of an object 144 that is struck by the beam emitted by the optics unit 108 along the axis 140. FIG. 1 shows the object 144 located on a rotary stage 124 supported by an X-Y table 120. The X-Y table 120 supports the rotary stage 124 via a rotation joint 122 that allows the rotary stage 124 to rotate about an axis parallel or coaxial with the axis 140.

The table 120 can move along X and Y axes (not shown) perpendicular to the axis 140, so that the soldering location 142 can be moved to different locations such as solder joint locations 130 on the object 144. The object 144 shown in FIG. 1 includes a printed circuit board 126 with electrical components 128 mounted on it. The electrical components 128 have metallic leads 132 which are to be soldered to metallic contact pads 134 on the printed circuit board 126. Each solder joint location 130 includes portions of one of the leads 132 and one of the pads 132. In accordance with an embodiment of the invention and as described further below, the leads 132 and the contact pads 134 can be soldered together by moving corresponding solder joint locations 130 through the soldering location 142 while the optics unit 108 is emitting laser light.

The size of the soldering location 142, or the spot size of the laser light at the soldering location 142, can be altered by adjusting or changing out a lens assembly in the lens cell 106, and/or adjusting a distance between the optics unit 108 and the soldering location 142 along the axis 140. An average intensity or energy density of the laser light at the soldering location can be altered by changing the spot size at the soldering location 142, and/or altering an amount of power supplied to the laser 102. The energy density can be represented, for example, in units of Watts per square centimeter ($W/cm^2$).

Figure 2A:
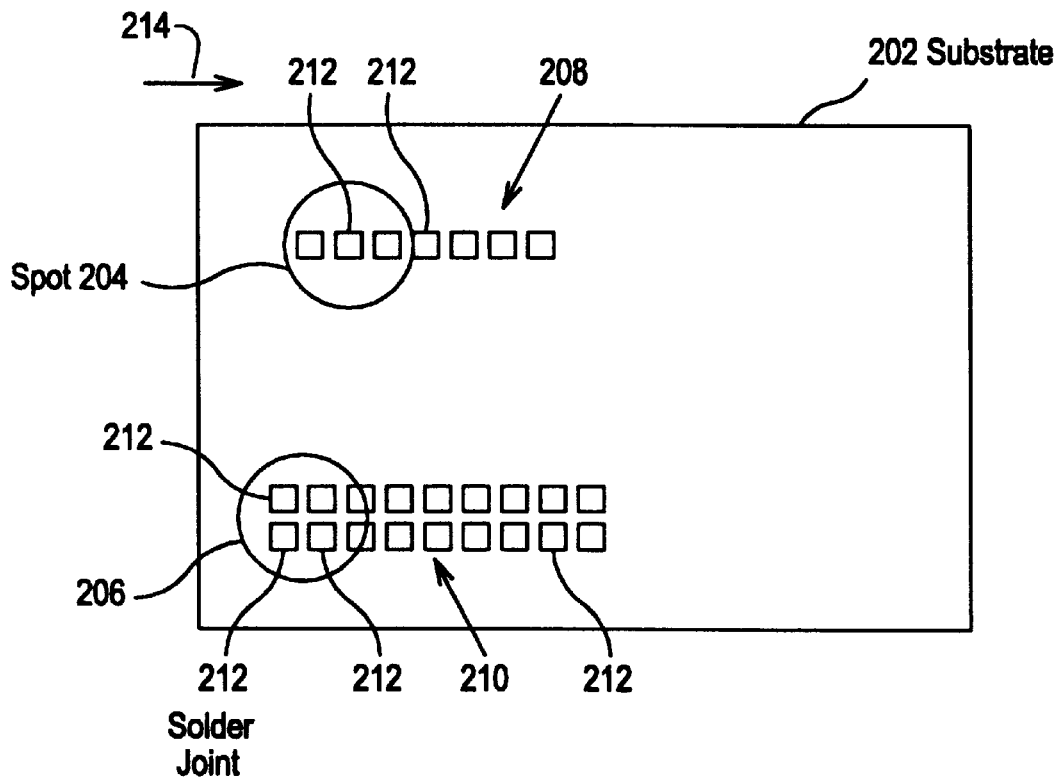
FIGS. 2A–2C show top views of components being soldered in accordance with exemplary embodiments of the invention.
Figure 2C:
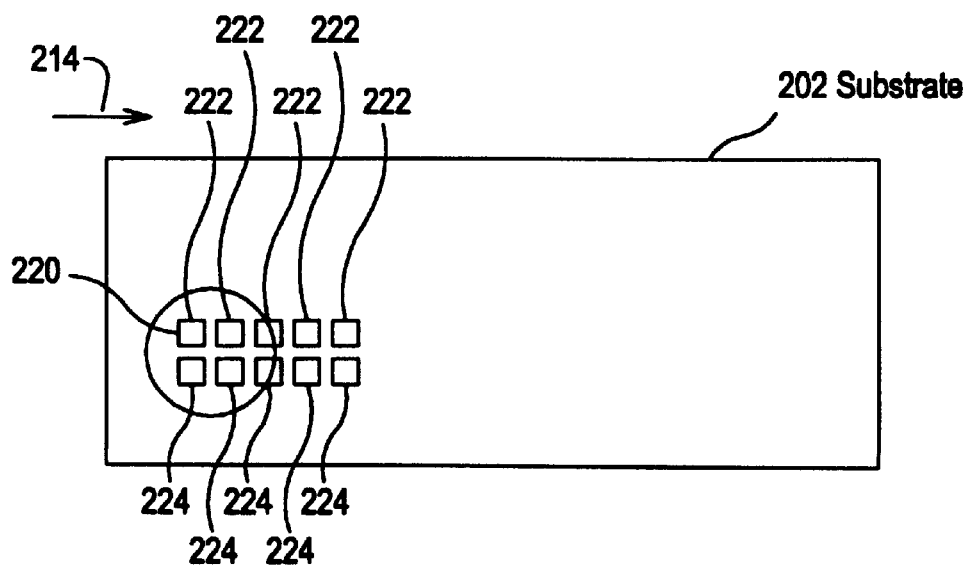
Figure 2B:
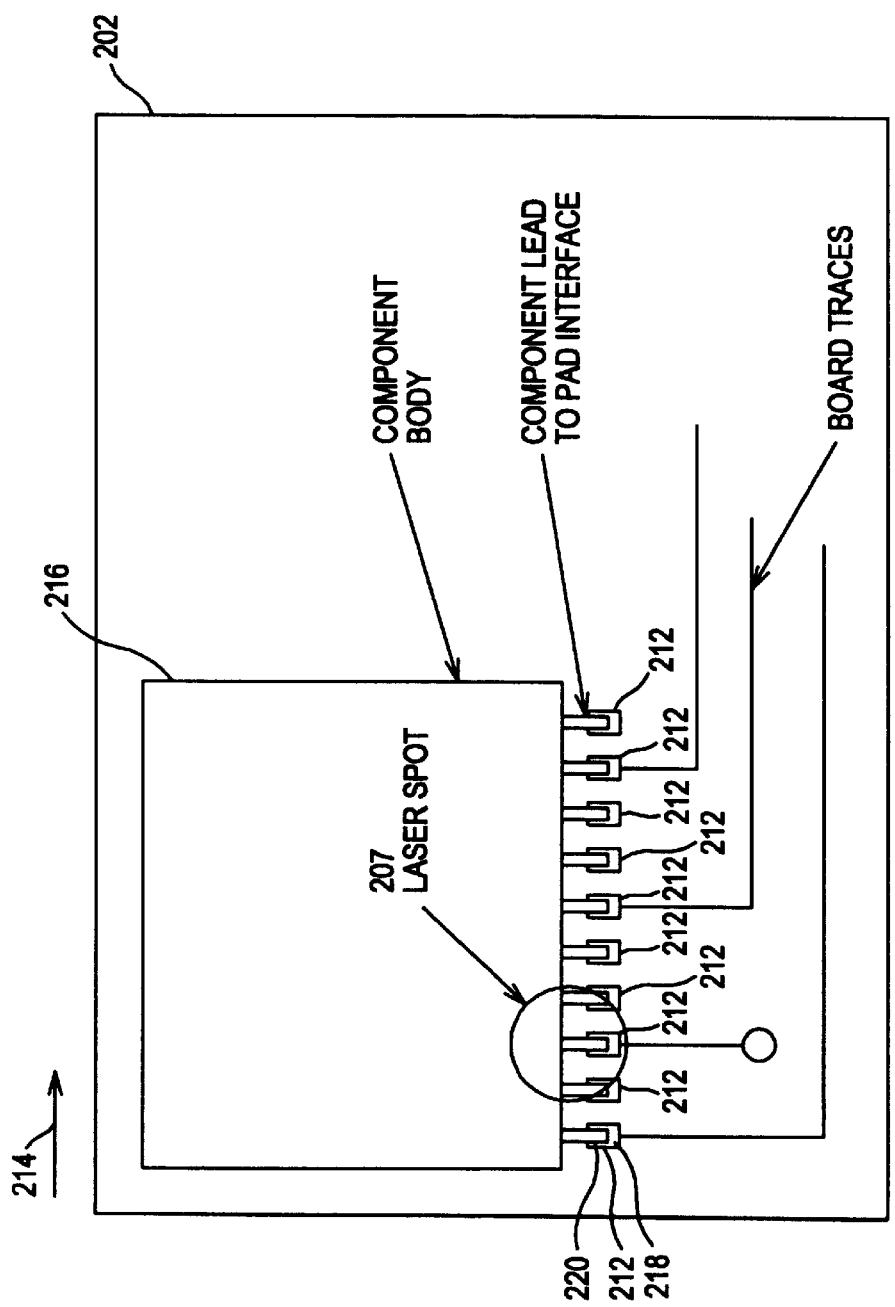

FIGS. 2A–2B show top views of components being soldered in accordance with exemplary embodiments of the invention. As shown in FIG. 2A, first and second sets 208 and 210 of solder joints 212 are located on a substrate 202. The substrate 202 can be, for example, a printed circuit board material such as, for example, Kevlar™, polyimide, cynate ester, or any other suitable material. A laser beam spot such as the beam spot 204 and the beam spot 206 can be sized, as shown in FIG. 2A, so that it can simultaneously encompass a plurality of solder joints. The beam spot 204 and the beam spot 206 can be moved or scanned, for example, along the sets 208 and 210 of solder joints in a first direction 214. The scanning can also be performed at a constant speed.

In a scanning mode, flux activation can take place.

As shown in FIG. 2B, each solder joint 212 includes, for example, a portion of a component lead 220 from the component package 216, and a pad 218 on the substrate 202 which can be connected to a board trace on the substrate 202. As shown in FIG. 2, a beam spot 207 can be sized and positioned so that as it moves in the direction 214 across solder joints 212 along a perimeter of a component package 216, each of the solder joints 212 has the same thermal appearance or presence within the beam spot 207. Thus, when the solder joints 212 have substantially the same thermal mass, all of the solder joints 212 will have similar heat absorption and transfer characteristics as the beam spot 207 moves over them with a substantially constant speed. In other words, the solder joints preferably are configured, and a path of each solder joint 212 through the beam spot 207 is selected, so that each of the solder joints 212 has substantially the same thermal mass and absorbs and transfers heat in a substantially equal fashion, with respect to the beam spot.

For example, although different ones of the solder joints 212 have different board traces, the beam spot 207 covers the solder joints 212 in an identical fashion as it moves relative to the substrate 202 in the direction 214, and does not cover any of the board traces. Thus, each of the solder joints 212 has substantially the same thermal mass and absorbs and transfers heat in a substantially equal fashion, with respect to the beam spot.

If the beam spot 207 were to cover a portion of a board trace connected to one of the solder joints 212, then the solder joint 212 would receive heat not only from the portion of the beam spot covering it but also from the portion of the board trace covered and heated by the beam spot 207. Since not all of the solder joints 212 have board traces on top of the substrate 202 that would be identically covered by the beam spot 207, in this situation different ones of the solder joints 212 would absorb and transfer heat differently, thus introducing a variation into the soldering process that could impair some or all of the resulting solder joints.

In accordance with exemplary embodiments of the invention, where different solder joints have different thermal masses, different paths of the different solder joints through the beam spot can be chosen appropriately to produce good quality solder joints. For example, as shown in FIG. 2C, where solder joints 222 have thermal masses that are different from thermal masses of solder joints 224, a path of each solder joint 222 through a beam spot 220 as the beam spot moves in the direction 214 across the solder joints and the substrate 202, can be different from a path of each solder joint 224 through the beam spot 220.

In accordance with exemplary embodiments of the invention, an intensity or energy density across the beam spot is homogeneous or uniform, i.e., there are no "hot spots" within the beam spot. The energy density across the beam spot is effectively uniform when variations in the energy density across the beam spot are sufficiently small enough that the beam spot can properly solder metallic elements without burning or otherwise damaging components, for example a circuit board or substrate within the beam spot.

If the energy density across the beam spot is insufficiently uniform, then during a soldering operation, hot spots within the beam spot or locations in the beam spot having a higher energy density can damage components in the beam spot. For example, the hot spots can burn a circuit board supporting one or more of the metallic components being soldered.

An energy density across the beam spot can be homogenized or made more uniform by defocusing the laser beam, for example by moving the beam spot away from a focus of the laser beam. The laser beam can be defocused, for example, thus blurring and blending together the individual contributions in the beam spot of the individual fibers in the optic fiber bundle 104 and reducing variations in energy density across the beam spot, until the energy density across the beam spot is effectively uniform, or until any desired level or degree of uniformity is achieved. The desired degree of uniformity can be greater, for example, than a degree of uniformity that is just barely sufficient to achieve acceptable solder joints without damaging objects in the beam spot at the soldering location.

In accordance with exemplary embodiments of the invention, solder is provided uniformly at each solder joint so that an amount of solder at each joint is substantially the same as the amounts of solder at other joints. Solder can be, for example, applied to a series or group of solder joints in the form of a continuous bead of solder paste, as is known in the art, or can be provided by placing one or more preformed shapes of solder at the series or group of solder joints. Any appropriate solder placement method can be used to provide solder at the solder joints, so that an amount of solder at each joint is consistent and substantially the same as the amounts of solder at the other joints that will pass through the same beam spot.

In accordance with exemplary embodiments of the invention, a beam spot having an appropriate spot size and an appropriate intensity or energy density which is homogeneous or effectively uniform across the spot, can be provided by defocusing the laser beam so that the soldering location where the beam spot is located is not at a focus of the laser beam, but is instead located at a distance away from the focus. For example, where laser light is conveyed from the laser 102 to the lens cell 106 via multiple optical fibers in the cable 104 shown in FIG. 1, the laser beam directed to the soldering location is defocused so that individual contributions of the optical fibers blend in the beam spot and are not distinct, so that the beam spot has a uniform intensity. In accordance with an exemplary embodiment of the invention, the beam spot is defocused just enough to cause the individual contributions of the optical fibers to blend in the beam spot. For example, the beam spot can be defocused a minimum amount necessary to provide the beam spot with an effectively uniform energy density at the soldering location.

Figure 3A:
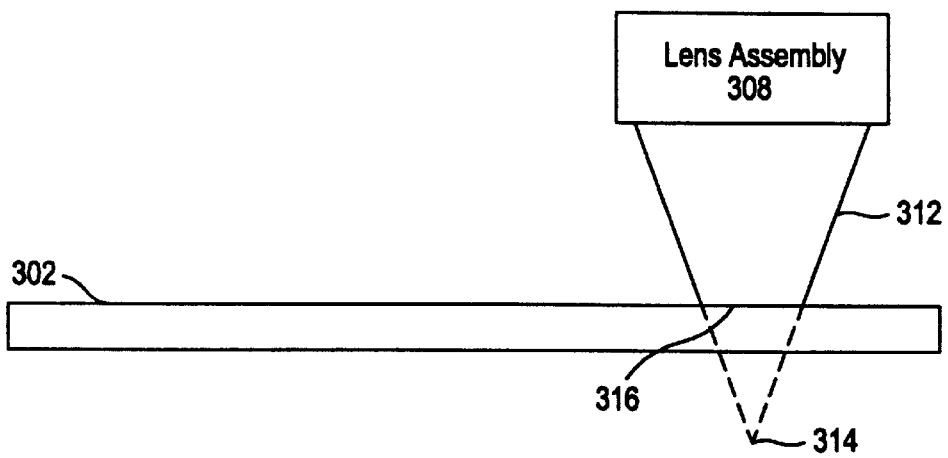
FIGS. 3A–3C show focus locations of a laser beam in accordance with exemplary embodiments of the invention.
Figure 3B:
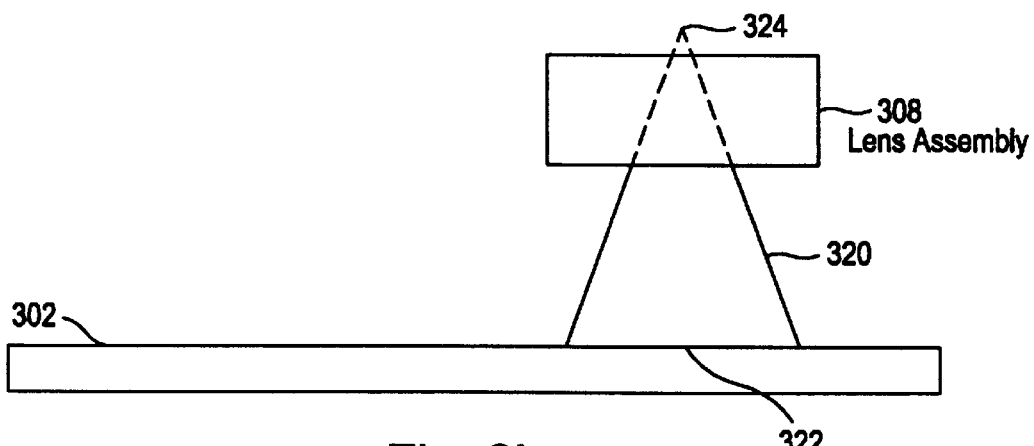
Figure 3C:
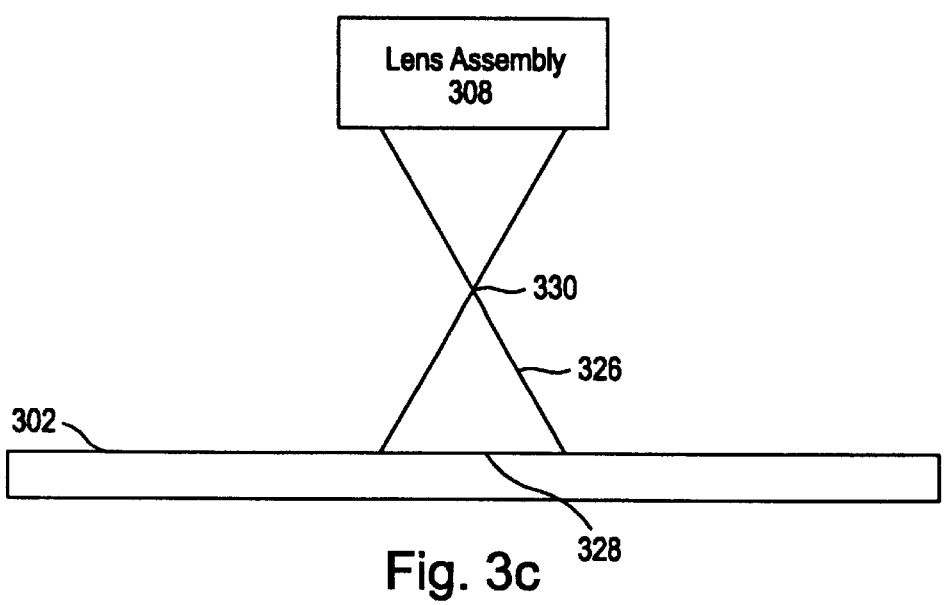

FIGS. 3A–3C show side views of different defocus methods or configurations that can be used in various exemplary embodiments of the invention. As shown in FIG. 3A, a defocused beam spot 316 is formed on a substrate 302 using a beam 312 emanating from a lens assembly 308, so that the beam spot 316 lies between the lens assembly 308 and a focus 314. As shown in FIG. 3B, the beam 320 diverges as it travels from the lens assembly 308 to the substrate 302 to form a defocused beam spot 322 on the substrate 302, so that a focus 324 of the beam lies behind the lens assembly 308. As shown in FIG. 3C, a focus 330 of a beam 326 lies between the lens assembly 308 and the defocused beam spot 328 on the substrate 302.

Figure 4:
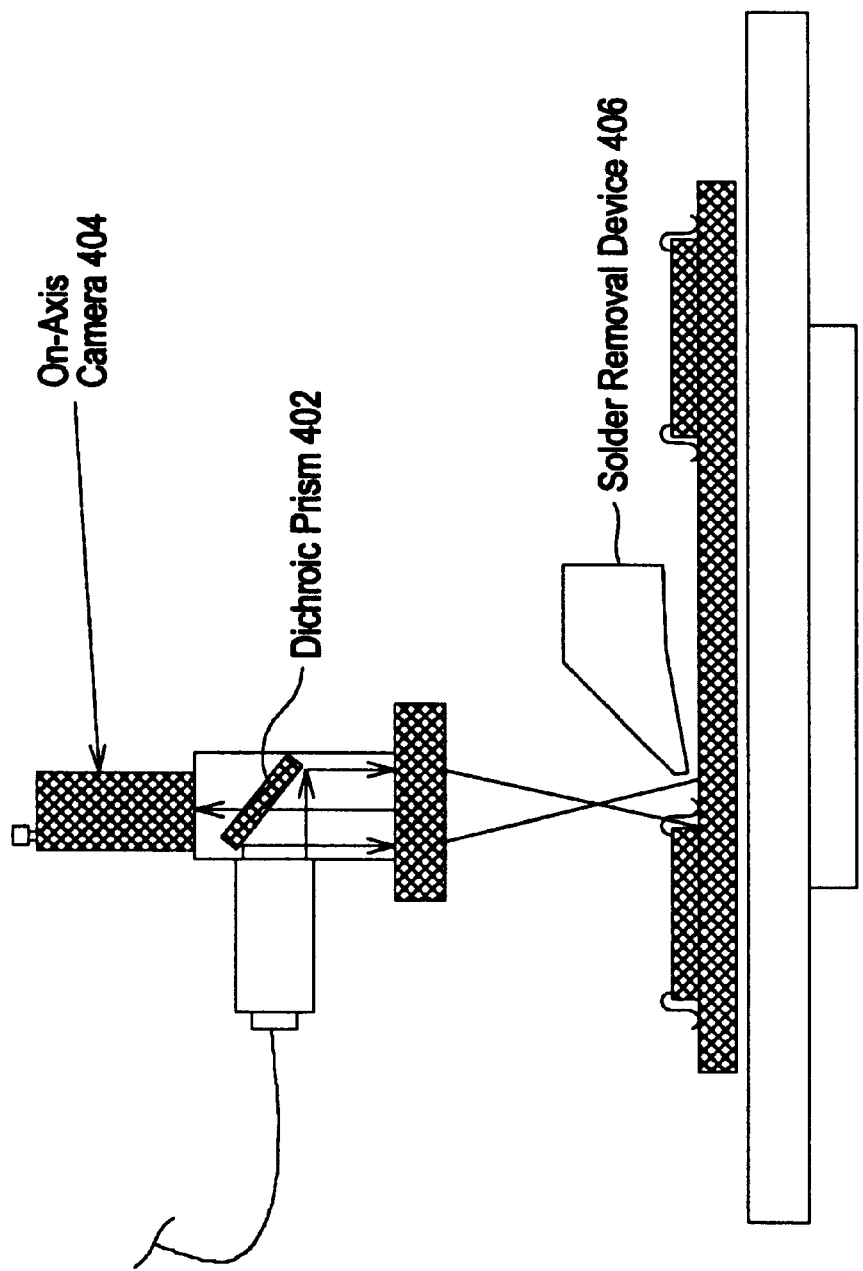
FIG. 4 shows an exemplary embodiment of the invention including a dichroic prism.

FIG. 4 shows an exemplary embodiment of the invention, including an on-axis camera 404 and a dichroic prism 402 for passing and deflecting light, as described above with respect to FIG. 1. As shown in FIG. 4, exemplary embodiments of the invention can also include a solder removal device 406 for desoldering components, for example so they can be removed.

Figure 5:
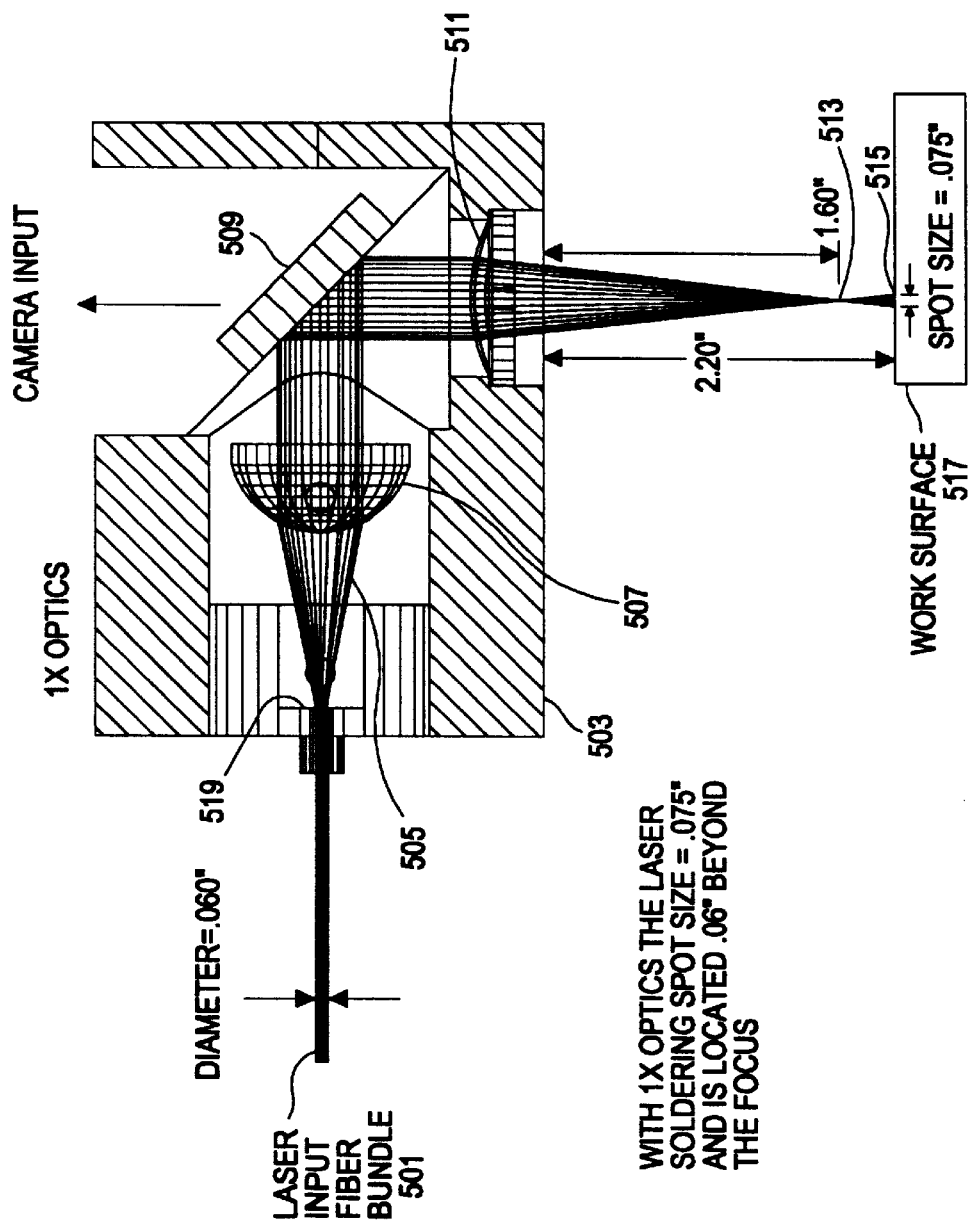

FIG. 5 shows a lens system in accordance with an exemplary embodiment of the invention. As shown in FIG. 5, a laser input fiber bundle 501 conveys laser light to an optics assembly housing 503. The beam 505 emitted by the laser input fiber bundle 501 inside the optics assembly housing 503 is bent by the first lens 507, and then strikes a dichroic prism 509 which deflects the beam 505 toward a second lens 511. The first and second lenses 505, 511 and optical distances between them and between the first lens 505 and an end 519 of the fiber bundle 501 are appropriately selected in accordance with well-known optical principles to provide a desired spot size at a soldering location 515 that is a desired working distance away from the optics assembly housing 503.

In particular, as shown in FIG. 5, the laser input fiber bundle 501 has an effective optical diameter of 0.060 inches. In other words, the diameter of the light beam 505 at the fiber bundle end 519 is 0.060 inches. The focus 513 of the beam 505 after exiting the second lens 511 is 1.60 inches distant from the optics assembly housing 503, and the soldering location 515 is located 0.60 inches further (i.e., 2.20 inches distant from the optics assembly housing 503) from the focus 513. Since the optics shown in FIG. 5 are arranged to have a 1× magnification, the beam diameter at the focus 513 is the same as the beam diameter at the fiber bundle end 519, i.e., 0.060 inches. The defocused beam or spot diameter at the soldering location 515 is 0.075 inches.

If, for example, the lens system shown in FIG. 5 had a 2× magnification instead of a 1× magnification, then the beam diameter at the focus 513 would be twice as large as the effective optical diameter of the fiber bundle 501, and would thus have a diameter of 0.120 inches.

With respect to FIG. 1, the lens cell 106 can include a first lens such as the first lens 507 shown in FIG. 5, and the imaging optics unit 108 can contain a second lens such as the second lens 511 shown in FIG. 5.

As those skilled in the art will appreciate, lens systems in accordance with the principles of the invention can be configured in different ways, with different magnifications, effective optical diameters of laser input fiber bundles, numbers of lenses, and so forth, so that the defocused beam or spot size at a soldering location will have an appropriate diameter at an appropriate working distance away from the lens system. The lens systems can be configured so that selected components of a lens system (for example, the lens cell 106) can be easily exchanged or adjusted to provide different magnifications, spot sizes, working distances, etc., to appropriately satisfy specific parameters and requirements of different soldering tasks.

The rate of convergence or divergence of the beam from the focus can also be appropriately selected so that when the working distance between the lens system and the soldering location is within a specified tolerance, the beam spot diameter and/or beam spot uniformity at the soldering location are also within specified tolerances. For example, a maximum resolution or minimum increment with which an exemplary laser soldering device in accordance with the invention can achieve an actual working distance can limit a maximum rate of convergence or divergence of the beam from the focus, so that the beam spot diameter and/or beam spot uniformity is within an acceptable tolerance.

In accordance with exemplary embodiments of the invention, the beam can be moved to a soldering location, turned on for a predetermined amount of time until one or more solder joints at the soldering location is properly soldered, turned off, and then moved to a new soldering location to repeat the cycle. In other words, the beam spot can be moved continuously at a constant speed across soldering locations, as described further above, or alternatively can be turned off, moved, turned on at a specific location, and so forth, so that the beam spot does not move with respect to the solder joints it is soldering, during times the laser is turned on.

In accordance with embodiments of the invention, relative movement between the laser beam and a component to be soldered can be provided in a variety of ways, for example by moving the component, moving the laser beam, or both. For example, in contrast to the apparatus shown in FIG. 1, a laser soldering device can be provided in accordance with exemplary embodiments of the invention in a gantry-type configuration, so that a portion of the device which emits the laser beam moves in two or more dimensions while the component to be soldered remains substantially fixed in place with respect to the remainder of the laser soldering device.

In accordance with exemplary embodiments of the invention, a proper defocus amount and laser power setting can be obtained for solder joint or set of solder joints by iteratively checking for damage from hot spots within the beam spot, checking for uniform damage within the beam spot, and checking whether the laser power setting is providing sufficient heat to properly perform the soldering operation, and appropriately adjusting a defocus amount of the laser beam and/or the laser power setting.

The defocus amount can be represented as a distance between a focus of the laser and a location of the defocused beam spot, as a percentage difference between a size of the beam spot at the focus and a size of the defocused beam spot, or in any other appropriate fashion.

As an amount of defocus of the beam spot is increased, for example beyond a minimum amount necessary to provide an effectively uniform energy density across the beam spot, it may be necessary to monitor the beam spot for energy density variations which are caused by flaws or variations in the optics.

For example, spherical aberrations in the optics can cause distortions in the beam which can become increasingly prominent as the amount of defocus is increased. When such flaws or variations cause an energy density variation in the beam spot at the soldering location that adversely effects the soldering process, the energy density variation can be corrected. For example, the amount of defocus can be appropriately reduced, and/or optics of higher quality can be used.

Since the size of the beam spot will change with distance from a focus of the laser beam, when the defocus amount of the laser beam is changed by changing a distance between the focus of the laser beam and the soldering location, the size of the beam spot at the soldering location will change accordingly. Accordingly, the size of the beam spot can also be iteratively or periodically checked to ensure that any difference between the actual size of the beam spot and a desired size of the beam spot is within acceptable tolerances. If the actual size of the beam spot is not close enough to the desired size, then the size of the beam spot at the focus of the laser can be appropriately adjusted, for example by adjusting or swapping optical elements to provide a different magnification.

FIG. 6 shows an exemplary procedure for properly adjusting a defocus amount and/or a laser power setting during a soldering process or during a calibration prior to a soldering process. After beginning at step 602, control proceeds to step 604 where a focus size, or a size of the laser beam spot at a focus of laser, is selected based on a desired defocused beam spot size at a soldering location. For example, a focus size that is slightly smaller than the desired beam defocused beam spot size can be initially selected. From step 604 control proceeds to step 606, where an initial laser power output is selected. From step 606, control proceeds to step 608, where a Flag is set equal to 1. As described in greater detail below, the Flag indicates whether a parameter has been adjusted. When none of the parameters needs adjustment, the calibration is complete. From step 608, control proceeds to step 610, where any damage is present from localized hot spots within the beam spot, for example damage to a substrate supporting one or more of the components being soldered. If at step 610 the answer is yes, then control proceeds to step 612, where a determination is made as to whether the laser beam is defocused or further defocused by an increment, for example by increasing a distance between the beam spot at the soldering location and a focus of the laser beam by an incremental amount. The increment can be appropriately chosen or selected depending on the particular arrangement and circumstances of the item(s) to be soldered and the configuration of the soldering device. From step 612 control proceeds to step 614, where the Flag is set equal to zero. From step 614, control proceeds to step 616. If at step 610 the answer is no, then control proceeds directly from step 610 to step 616.

At step 616 a determination is made whether there is uniform damage across a non-local area within the beam spot at the soldering location, or uniform damage across a non-local area of an object currently or formerly in the beam spot. Uniform damage indicates, for example, that an overall energy density across the beam spot is too high. Accordingly, if uniform damage is present, control proceeds from step 616 to step 618, where a power output of the laser is reduced. From step 618 control proceeds to step 620, where the Flag is set equal to zero. From step 620, control proceeds to step 622. If at step 616 uniform damage is not present, then control proceeds directly from step 616 to step 622.

At step 622 a determination is made whether the laser is providing sufficient heat to properly solder the components, or in other words whether the solder joints are becoming sufficiently hot for the solder to melt and flow properly to create a sound solder joint. If no, then control proceeds to step 624 where the power output of the laser is increased. From step 624 control proceeds to step 626, where the Flag is set equal to zero. From step 626, control proceeds to step 628. If at step 622 it is determined that the laser is providing sufficient heat, then control proceeds directly from step 622 to step 628.

At step 628, a determination is made whether the beam spot size at the soldering location is acceptably close to the desired beam spot size at the soldering location. If no, then control proceeds to step 630, where the beam spot size is adjusted, for example by appropriately selecting a different lens cell magnification so that the beam spot at the focus of the laser beam changes size. From step 630 control proceeds to step 632, where the Flag is set equal to zero. From step 632, control proceeds to step 634. If at step 628 the beam spot size at the soldering location is determined to be acceptably close to the desired beam spot size, then control proceeds directly from step 628 to step 634.

At step 634, a determination is made whether the Flag is equal to zero. If yes, then control returns to step 608, and the process repeats. If no, then the calibration or adjustment of parameters is complete, and control proceeds from step 634 to step 636 where the process ends.

In accordance with an exemplary embodiment of the invention, where the laser wavelength used for soldering is outside the human visual range, a central one of the optic fibers in the optic fiber bundle 104 can be provided with a laser wavelength that is within the human visual range, and the resulting visible beam can be used to indicate to an operator where the soldering location is. Since the visible beam also passes through the optics, it can also be used to help the operator determine where the focus of the laser (or of laser light passing through the optics) is. For example, the operator can move the soldering location along the z-axis until the soldering location is at the focus. The operator will know that the soldering location is at the focus, because the beam spot of visible laser light will be, for example, smallest, most intense, and so forth. Then, in situations where the operator knows ahead of time what the proper amount of defocus is for the soldering or desoldering task at hand, for example a precise linear distance along the z-axis from focus, the operator can simply move the soldering location by the known amount to present the desired amount of defocus at the soldering location.

In accordance with an exemplary embodiment of the invention, paper that is sensitive to the laser wavelength used for soldering can also be used to help an operator determine a soldering location at which the beam spot has a proper amount of defocus, or at least an initial amount of defocus that can be further tuned or adjusted. Further adjustment can be performed by, for example, running several test boards through the machine, and/or employing the process illustrated in FIG. 6. The operator can place a piece of the paper at the soldering location, turn on the laser, and then observe burn patterns on the paper caused by the laser beam spot at the soldering location. When the burn pattern appears homogeneous or uniform across the beam spot to the naked human eye, the operator can conclude that the beam spot is properly defocused, or at least that an initial amount of defocus has been properly selected.

It will be appreciated by those skilled in the art that the present invention can be embodied in other specific forms without departing from the spirit or essential characteristics thereof, and that the invention is not limited to the specific exemplary embodiments described herein. The presently disclosed exemplary embodiments are therefore considered in all respects to be illustrative and not restrictive. The scope of the invention is indicated by the appended claims rather than the foregoing description, and all changes that come within the meaning and range and equivalents thereof are intended to be embraced therein.

What is claimed is:

1. A device for soldering metallic components, comprising:
    a laser for providing a beam to heat the metallic components and having a wavelength selected based on light absorption characteristics of the metallic components; and
    a defocusing mechanism for defocusing the beam to provide a beam spot having an effectively uniform energy density at a soldering location that is located at a predetermined distance away from a focus of the beam.

2. The device of claim 1, further comprising:
    a support table for supporting the metallic components;
    a movement mechanism for providing relative movement between the table and the laser along at least one of three orthogonal axes and for providing rotational movement along at least one of the three orthogonal axes; and
    a power control for modulating a power output of the laser.

3. The device of claim 1, wherein the power control modulates the power output of the laser to maintain a constant level of power as the beam moves across one or more solder joint locations during soldering.

4. The device of claim 1, further comprising a mechanism for providing a predetermined amount of solder each solder joint location of the metallic components.

5. The device of claim 1, wherein a size of the beam spot is selected to simultaneously encompass a plurality of solder joint locations.

6. The device of claim 1, wherein the wavelength of the laser is chosen to maximize absorption of the beam by the metallic components.

7. The device of claim 1, wherein the metallic components are provided on a non-metallic substrate and the wavelength of the laser is chosen to maximize a ratio of a) absorption by the metallic components of light emitted by the laser to b) absorption by the non-metallic substrate of light emitted by the laser.

8. The device of claim 5, wherein the wavelength of the laser is between about 790 nanometers and about 860 nanometers.

9. The device of claim 8, wherein the wavelength of the laser is about 825 nanometers.

10. The device of claim 1, further comprising:
    a camera arranged to capture at least one image of the soldering location, wherein an optical axis of the camera is coaxial with an axis of the laser beam; and
    a dichroic prism arranged to deflect laser light toward the soldering location and to pass visible light along the optical axis of the camera.

11. The device of claim 1, wherein a focus of the laser beam is located between a source of the beam and the soldering location.

12. The device of claim 1, further comprising a solder removal device for removing molten solder at or near the soldering location.

13. The apparatus of claim 7, wherein the non-metallic substrate comprises at least one of Kevlar™, polyimide, and cynate ester.

14. The device of claim 4, wherein the mechanism for providing solder applies solder to a plurality of solder joints in the form of a continuous bead of solder paste.

15. The device of claim 1, further comprising an optic fiber bundle including a plurality of individual optic fibers, wherein the defocusing mechanism includes a lens assembly, the optic fiber bundle provides laser light to the lens assembly, the beam emanates from the lens assembly, and the defocusing mechanism defocuses the beam emanating from the lens assembly to homogenize individual contributions of the optic fibers in the beam spot at the soldering location so that the beam spot has an effectively uniform energy density.

16. The device of claim 15, wherein the defocusing mechanism homogenizes the individual contributions of the optic fibers in the beam spot at the soldering location so that the energy density across the beam spot has a degree of uniformity that is greater than a minimum amount necessary for the energy density to be effectively uniform.

17. The device of claim 15, wherein the defocusing mechanism homogenizes the individual contributions of the optic fibers in the beam spot at the soldering location so that the energy density across the beam spot is uniform.

18. The device of claim 1, wherein the defocusing mechanism defocuses the beam so that the beam spot has a degree of uniformity that is greater than a minimum amount necessary for the energy density to be effectively uniform.

19. The device of claim 18, wherein the defocusing mechanism defocuses the beam so that the energy density across the beam spot is uniform.

20. A method for soldering metallic components, comprising the step of:

defocusing a laser beam to provide a beam spot having an effectively uniform energy density at a soldering location.

21. The method of claim 20, further comprising the step of selecting a wavelength of the laser to maximize absorption of the beam by the metallic components.

22. The method of claim 21, wherein the selected wavelength is between about 790 nanometers and 860 nanometers.

23. The method of claim 15, further comprising the step of sizing the beam spot to simultaneously encompass a plurality of solder joint locations.

24. The method of claim 20, further comprising the step of modulating a power output of the laser to maintain a constant level of power as the beam moves across one or more solder joint locations.

25. The method of claim 20, wherein the focus is located between a source of the laser beam and the soldering location.

26. The method of claim 20, further comprising the step of removing molten solder from a solder joint location heated by the laser.

27. The method of claim 20, further comprising the step of selecting a wavelength of the laser to maximize a ratio of a) absorption by the metallic components of light emitted by the laser to b) absorption by the non-metallic substrate of light emitted by the laser.

28. The method of claim 20, further comprising the step of scanning the beam across one or more solder joint locations.

29. The method of claim 28, further comprising the step of selecting a size of the beam spot so that the one or more solder joint locations appear thermally similar to each other with respect to the beam spot.

30. The method of claim 14, further comprising the step of selecting a path of each solder joint location through the beam spot so that the one or more solder joint locations appear thermally similar to each other with respect to the beam spot.

31. The method of claim 16, wherein the laser beam is defocused a minimum amount necessary to provide the beam spot having the effectively uniform energy density at the soldering location.

32. The method of claim 20, wherein the beam spot is located at a distance away from a focus of the laser beam.

33. The method of claim 22, wherein the metallic components are provided on a non-metallic substrate comprising at least one of Kevlar™, polyimide, and cynate ester.

34. The method of claim 28, wherein the laser beam includes individual contributions from a plurality of optic fibers, and the defocusing step homogenizes the individual contributions by defocusing the beam so that the beam spot has an effectively uniform energy density.

35. The method of claim 34, wherein the defocusing step homogenizes the individual contributions by defocusing the beam so that the beam spot has a degree of uniformity that is greater than a minimum amount necessary for the energy density to be effectively uniform.

36. The method of claim 35, wherein the defocusing step homogenizes the individual contributions by defocusing the beam so that the energy density across the beam spot is uniform.

37. The method of claim 23, further comprising the steps of:

scanning the beam across a plurality of solder joints; and
selecting different paths through the beam spot for ones of the plurality of solder joints having different thermal masses.

38. The method of claim 20, wherein the defocusing step defocuses the beam so that the beam spot has a degree of uniformity that is greater than a minimum amount necessary for the energy density to be effectively uniform.

39. The method of claim 38, wherein the defocusing step defocuses the beam so that the energy density across the beam spot is uniform.

40. The method of claim 30, wherein the defocusing step defocuses the beam so that the beam spot has a degree of uniformity that is greater than a minimum amount necessary for the energy density to be effectively uniform.

41. The method of claim 40, wherein the defocusing step defocuses the beam so that the energy density across the beam spot is uniform.

42. A method for soldering metallic components, comprising the steps of:

providing a laser beam to heat the metallic components;
selecting a wavelength of the laser beam based on light absorption characteristics of the metallic components; and
defocusing the laser beam to provide a beam spot having an effectively uniform energy density across the beam spot at a soldering location that is a distance away from a focus of the beam.

43. The method of claim 42, further comprising the step of:

when localized hot spots within the beam spot damage an object at the soldering location, changing the distance between the soldering location and the focus of the beam to further homogenize the energy density across the beam spot.

44. The method of claim 43, further comprising the step of:
   when the beam spot uniformly damages an object at the soldering location across an area in the beam spot corresponding to multiple optical fibers that each convey a portion of the laser beam, reducing a power of the laser beam.

45. The method of claim 44, further comprising the step of:
   when heat provided by the laser beam is insufficient to properly solder the metallic components, increasing the power of the laser beam.

46. The method of claim 42, wherein the energy density across the beam spot at the soldering location is effectively uniform when the beam properly solders metallic components in the beam spot without damaging any object in the beam spot during soldering.

47. The method of claim 46, wherein the object is a circuit board supporting at least one of the metallic components.

48. The method of claim 42, further comprising the step of applying solder to a plurality of solder joints in the form of a continuous bead of solder paste.

49. The method o f claim 43, further comprising the steps of:
   decreasing an amount of defocus of the beam spot when the localized hot spots are caused by spherical aberrations in optics through which the laser beam passes; and
   increasing an amount of defocus of the beam spot when the localized hot spots are caused by individual contributions in the beam spot from a plurality of optic fibers carrying the light which forms the laser beam.

* * * * *

UNITED STATES PATENT AND TRADEMARK OFFICE
CERTIFICATE OF CORRECTION

PATENT NO.    : 6,278,078 B1
DATED         : August 21, 2001
INVENTOR(S)   : John Walvoord et al.

It is certified that error appears in the above-identified patent and that said Letters Patent is hereby corrected as shown below:

Column 10,
Lines 27-29, "The device of claim 1, further comprising a mechanism for providing a predetermined amount of solder at each solder joint location of the metallic components."

Column 11,
Lines 38-40, "The method of claim [15] 22, further comprising the step of sizing the beam spot to simultaneously encompass a plurality of solder joint locations."

Columns 11 and 12,
Lines 66-67 and 1-3, "The method of claim [14] 28, further comprising the step of selecting a path of each solder joint location through the beam spot so that the one or more solder joint locations appear thermally similar to each other with respect to the beam spot."

Column 12,
Lines 4-7, "The method of claim [16] 23, wherein the laser beam is defocused a minimum amount necessary to provide the beam spot having the effectively uniform energy density at the soldering location."

Signed and Sealed this

Twenty-first Day of May, 2002

Attest:

Attesting Officer

JAMES E. ROGAN
*Director of the United States Patent and Trademark Office*